(12) United States Patent
Jeon et al.

(10) Patent No.: US 7,583,219 B2
(45) Date of Patent: Sep. 1, 2009

(54) METHOD OF CONTROLLING PIPELINE ANALOG-TO-DIGITAL CONVERTER AND PIPELINE ANALOG-TO-DIGITAL CONVERTER IMPLEMENTING THE SAME

(75) Inventors: Young Deuk Jeon, Daejeon (KR); Young Kyun Cho, Daejeon (KR); Kwi Dong Kim, Daejeon (KR); Jong Kee Kwon, Daejeon (KR); Jong Dae Kim, Daejeon (KR); Seung Chul Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/027,495

(22) Filed: Feb. 7, 2008

(65) Prior Publication Data
US 2009/0033530 A1    Feb. 5, 2009

(30) Foreign Application Priority Data
Aug. 1, 2007    (KR) ...................... 10-2007-0077314

(51) Int. Cl.
*H03M 1/38*    (2006.01)
(52) U.S. Cl. ...................................... 341/161; 341/155
(58) Field of Classification Search ................. 341/161, 341/143, 156, 120, 155, 172
See application file for complete search history.

(56) References Cited

U.S. PATENT DOCUMENTS 6,396,429 B2 * 5/2002 Singer et al. ................. 341/155
7,129,881 B2 * 10/2006 Franz .......................... 341/161
7,310,058 B2 * 12/2007 Udupa et al. ................. 341/161
7,339,512 B2 * 3/2008 Gulati et al. ................. 341/172

FOREIGN PATENT DOCUMENTS

KR    1019980069864 B1    10/1998
KR    1020060088972 A    8/2006

OTHER PUBLICATIONS

Dong-Young Chang; "Design Techniques for a Pipelined ADC Without Using a Front-End Sample-and-Hold Amplifier", IEEE Transactions on Circuits and Systems-I:Regular Papers, vol. 51, No. 11, Nov. 2004, pp. 2123-2132.
Young-Deuk Jeon, et al.; "A 4.7mW 0.32mm$^2$ 10b 30MS/s Pipelined ADC Without a Front-End S/H in 90nm CMOS", 2007 IEEE International Solid-State Circuits Conference, vol. 50, ISSN 0193-6530, pp. 456-457, & 615.

* cited by examiner

*Primary Examiner*—Brian Young
(74) *Attorney, Agent, or Firm*—Ladas & Parry LLP

(57) ABSTRACT

Provided are a pipeline Analog-to-Digital Converter (ADC) without a front-end Sample-and-Hold Amplifier (SHA) and a method of controlling the same. The method includes the steps of: simultaneously sampling, at an ADC and a residual signal generator included in a first stage, an analog input signal and respectively generating a first sampling value and a second sampling value; holding, at the residual signal generator, the second sampling value, and simultaneously amplifying and converting, at the ADC, the first sampling value into a corresponding digital code; and generating, at the residual signal generator, a residual signal using the digital code. The pipeline ADC and method of controlling the same minimize sampling mismatch caused by removing a front-end SHA, thereby ensuring stable performance without a front-end SHA. Since a front-end SHA is not used, it is possible to reduce chip size and power consumption, and improve the performance of the ADC.

16 Claims, 6 Drawing Sheets

METHOD OF CONTROLLING PIPELINE ANALOG-TO-DIGITAL CONVERTER AND PIPELINE ANALOG-TO-DIGITAL CONVERTER IMPLEMENTING THE SAME

CROSS-REFERENCE TO RELATED APPLICATION

This application claims priority to and the benefit of Korean Patent Application No. 2007-77314, filed Aug. 1, 2007, the disclosure of which is incorporated herein by reference in its entirety.

BACKGROUND

1. Field of the Invention

The present invention relates to a method of controlling a pipeline Analog-to-Digital Converter (ADC), and more particularly, to a pipeline ADC without a front-end Sample-and-Hold Amplifier (SHA) and a method of controlling a point in time for sampling to minimize sampling mismatch occurring in the pipeline ADC.

This work was supported by the IT R&D program of MIC/IITA. [2006-S-006-02, Components/Module technology for Ubiquitous Terminals].

2. Discussion of Related Art

Recently, the speed of ADC has increased in systems requiring high-speed information processes and in apparatuses for recording and replaying optical-discs, such as compact discs (CDs) and digital versatile discs (DVDs). Since a full flash ADC has a resolution limit and consumes a lot of power due to its structure, it is difficult to implement a high resolution at high speed with low power. Therefore, a pipeline ADC that can implement a high resolution at high speed is preferred in many application fields.

FIG. 1 is a block diagram of a conventional pipeline ADC.

Referring to FIG. 1, the pipeline ADC comprises a front-end SHA 110, a plurality of stages 120, a flash ADC 130 and a digital correction circuit 140. Each of the stages 120 comprises a Multiplying Digital-to-Analog Converter (MDAC) 121 and a flash ADC 122. Here, the flash ADC 122 serves as an ADC that quantizes and converts an analog input signal into an N-bit digital code. The MDAC 121 serves as a residual signal generator that converts the digital code converted by the flash ADC 122 back into an analog value, subtracts the converted analog value from the input signal, amplifies the result to generate a residual signal, and transfers the generated residual signal to a next stage. Therefore, it is possible to repeat the same analog-to-digital conversion process using the transferred residual signal in the next stage. The final stage does not need to transfer a residual signal to the next stage and thus consists of the flash ADC 130 alone. For example, an analog input signal $V_{in}$ may be converted into N-bit digital codes by the K stages 120 and the flash ADC 130, and each of the N-bit digital codes may be finally converted into a (K(N−1)+N)-bit digital signal by the digital correction circuit 140.

In the analog-to-digital conversion process of each stage, the front-end SHA 10 positioned at the fore part of the pipeline ADC samples an input signal during a half of an operating clock, holds the sampled input signal during the other half, and simultaneously supplies the sampled input signal to the MDAC 121 and the flash ADC 122 constituting a first stage, thereby serving to minimize sampling mismatch that may occur between the MDAC 121 and the flash ADC 122.

In spite of such an advantage, with the increase in the operating speed and the resolution of the ADC, the front-end SHA 110 comprising an amplifier and a plurality of capacitors consumes a lot of power due to the bandwidth of the amplifier and a limit in direct current (DC) gain, and occupies a large area due to large capacitors. In addition, since the front-end SHA 110 is positioned at the fore part of the pipeline ADC, the noise and the non-linear characteristic of the capacitors and the amplifier included in the front-end SHA 110 may affect the entire ADC and may deteriorate the performance of the ADC. To solve this problem, a pipeline ADC without the front-end SHA 110 has been suggested.

FIG. 2 is a block diagram of a pipeline ADC without a front-end SHA.

Referring to FIG. 2, the pipeline ADC without a front-end SHA comprises a plurality of stages 210, a flash ADC 220 and a digital correction circuit 230. Like the conventional pipeline ADC, each of the stages 210 comprises an MDAC 211 and a flash ADC 212. In other words, the pipeline ADC without a front-end SHA has the same structure as the conventional pipeline ADC shown in FIG. 1, except that the SHA 110 at an input end is removed. However, as mentioned above, a front-end SHA serves to minimize sampling mismatch between an MDAC and a flash ADC constituting a first stage. Thus, the structure of the pipeline ADC without a front-end SHA may cause serious sampling mismatch and drastically deteriorate the performance of the pipeline ADC.

FIG. 3A is a timing diagram showing a conventional stage-operating clock, and FIG. 3B is a circuit diagram of a stage operating according to the conventional clock.

Referring to FIGS. 3A and 3B, an analog input signal $V_{in}$ is directly applied to an MDAC 310 and a flash ADC 320 constituting a first stage. The MDAC 310 samples the analog input signal $V_{in}$ that is applied when a Q2P clock goes low, and stores the sampled signal in a capacitor $C_{MS}$ 311.

At the same time, the analog input signal $V_{in}$ applied to the flash ADC 320 is processed by a preamp 321 and a latch 322 constituting the flash ADC 320. The preamp 321 compares and amplifies the analog input signal $V_{in}$ with a reference voltage REF1 sampled in a capacitor $C_{FS}$ 323 while a previous Q1 clock is high. Subsequently, the latch 322 samples a preamp output value when a Q2PB clock, which has a phase difference of 180 degrees with respect to the Q2P clock, goes high, i.e., when the Q2P clock goes low, and determines a digital code corresponding to the analog input signal $V_{in}$. The digital code determined by the latch 322 is transferred to the MDAC 310 when a Q1 clock is high, and the MDAC 310 generates a residual signal using the digital code and transfers the generated residual signal to a next stage.

In this operation, the digital code transferred from the latch 322 to the MDAC 310 is converted from the preamp output signal at a point in time when the Q2P clock changes. Thus, the digital code substantially transferred to the MDAC 310 is converted from the analog input signal $V_{in}$ at the point in time calculated by subtracting a preamp delay time $\Delta\cdot\tau$, caused by the preamp 321, from the point in time when the Q2P clock changes.

That is, the MDAC 310 samples the analog input signal $V_{in}$ at the point in time when the Q2P clock changes, and the flash ADC 320 samples the analog input signal $V_{in}$ at the point in time (Q2P−$\Delta\cdot\tau$) preceding the point in time when the Q2P clock changes by the preamp delay time $\Delta\cdot\tau$ and transfers a processed result to the MDAC 310. Therefore, the values of the analog input signal $V_{in}$ sampled by the MDAC 310 and the flash ADC 320 may be different from each other. A sampling aperture error $V_e$ due to sampling mismatch between the MDAC 310 and the flash ADC 320 may be expressed by a formula given below, and the sampling aperture error $V_e$ increases with increase in an input frequency $f_{in}$.

$$V_e = 2\pi \cdot f_{in} V_{REF}(\Delta \tau)$$ [Formula 1]

Here, $\Delta \tau$ denotes a preamp delay time, $f_{in}$ denotes an input frequency, and $V_{REF}$ denotes an input voltage magnitude. Such an aperture error may have influence on determining a residual signal to be transferred from an MDAC to the next stage, and thereby may seriously deteriorate the performance of an entire ADC.

SUMMARY OF THE INVENTION

The present invention is directed to providing a method of minimizing sampling mismatch caused in a pipeline Analog-to-Digital Converter (ADC) without a front-end Sample-and-Hold Amplifier (SHA).

One aspect of the present invention provides a method of controlling a pipeline ADC without a front-end SHA, the method comprising the steps of: simultaneously sampling, at an ADC and a residual signal generator included in a first stage, an analog input signal and respectively generating a first sampling value and a second sampling value; holding, at the residual signal generator, the second sampling value, and simultaneously amplifying and converting, at the ADC, the first sampling value into a corresponding digital code; and generating, at the residual signal generator, a residual signal using the digital code.

Another aspect of the present invention provides a pipeline Analog-to-Digital Converter (ADC) without a front-end Sample-and-Hold Amplifier (SHA) comprising a plurality of stages, wherein a first stage comprises: an ADC for sampling an analog input signal to generate a first sampling value, and amplifying the first sampling value to convert the first sampling value into a corresponding digital code; and a residual signal generator for simultaneously sampling the analog input signal together with the ADC to generate a second sampling value, and holding the second sampling value while the ADC amplifies the first sampling value.

Still another aspect of the present invention provides a method of controlling a pipeline ADC without a front-end SHA, the method comprising the steps of: applying an analog input signal to a residual signal generator and an ADC included in a first stage; sampling, at the residual signal generator, the analog input signal; after a delay time of a preamp, determining, at a latch of the ADC, a digital code corresponding to the analog input signal using an output value of the preamp; and generating, at the residual signal generator, a residual signal using the digital code.

Yet another aspect of the present invention provides a pipeline Analog-to-Digital Converter (ADC) without a front-end Sample-and-Hold Amplifier (SHA) comprising a plurality of stages, wherein a first stage comprises: a preamp for receiving an analog input signal and amplifying and outputting the analog input signal; a latch for receiving the output value of the preamp and determining a digital code corresponding to the analog input signal using the output value of the preamp; and a residual signal generator for sampling the analog input signal ahead of a point in time when the latch receives the output value of the preamp by a preamp delay time, and generating a residual signal using the digital code.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Figure 1:
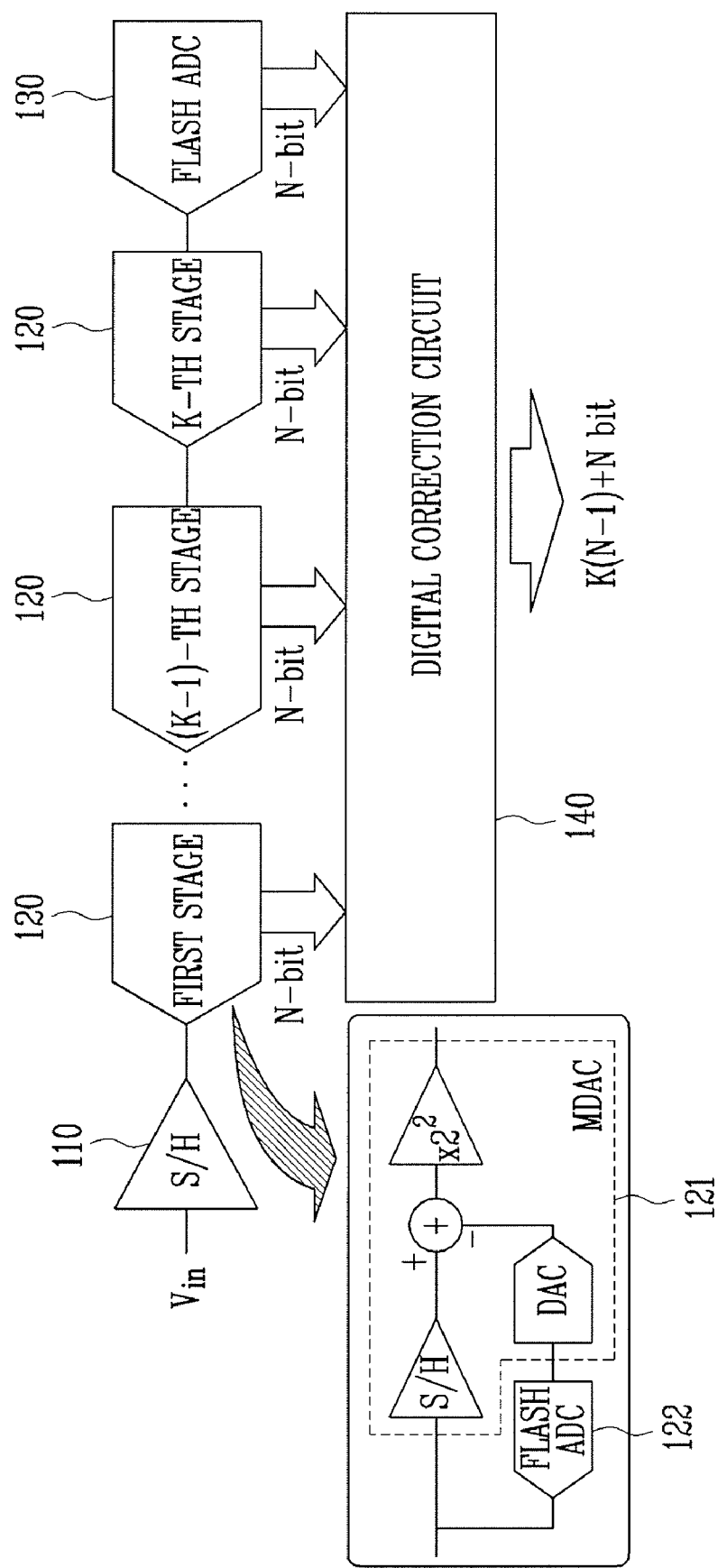
FIG. 1 is a block diagram of a conventional pipeline Analog-to-Digital converter (ADC)
Figure 2:
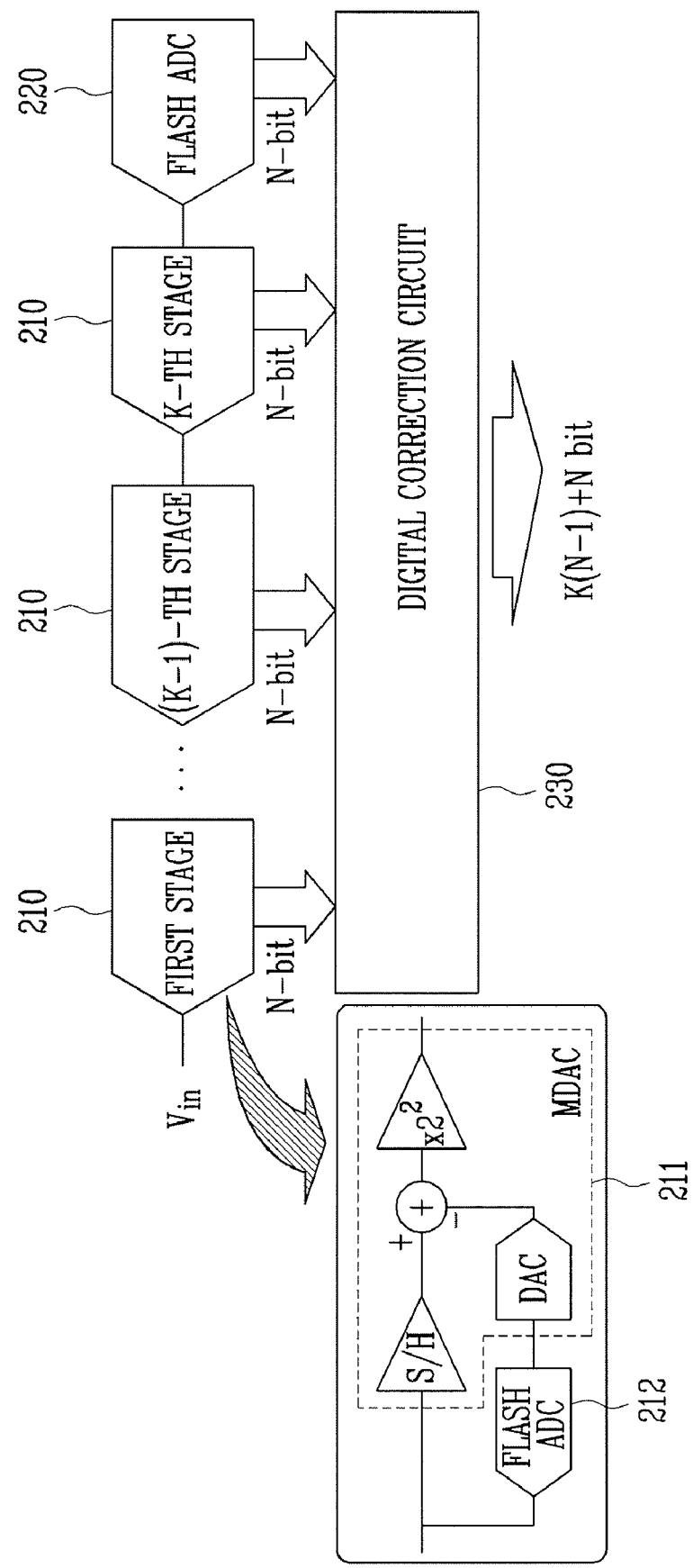
FIG. 2 is a block diagram of a pipeline ADC without a front-end Sample-and-Hold Amplifier (SHA)
Figure 3A:
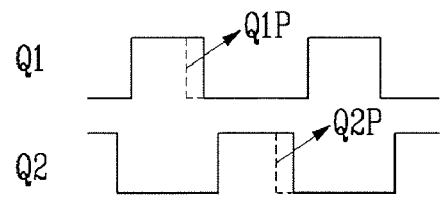
FIG. 3A is a timing diagram showing a conventional stage-operating clock.
Figure 3B:
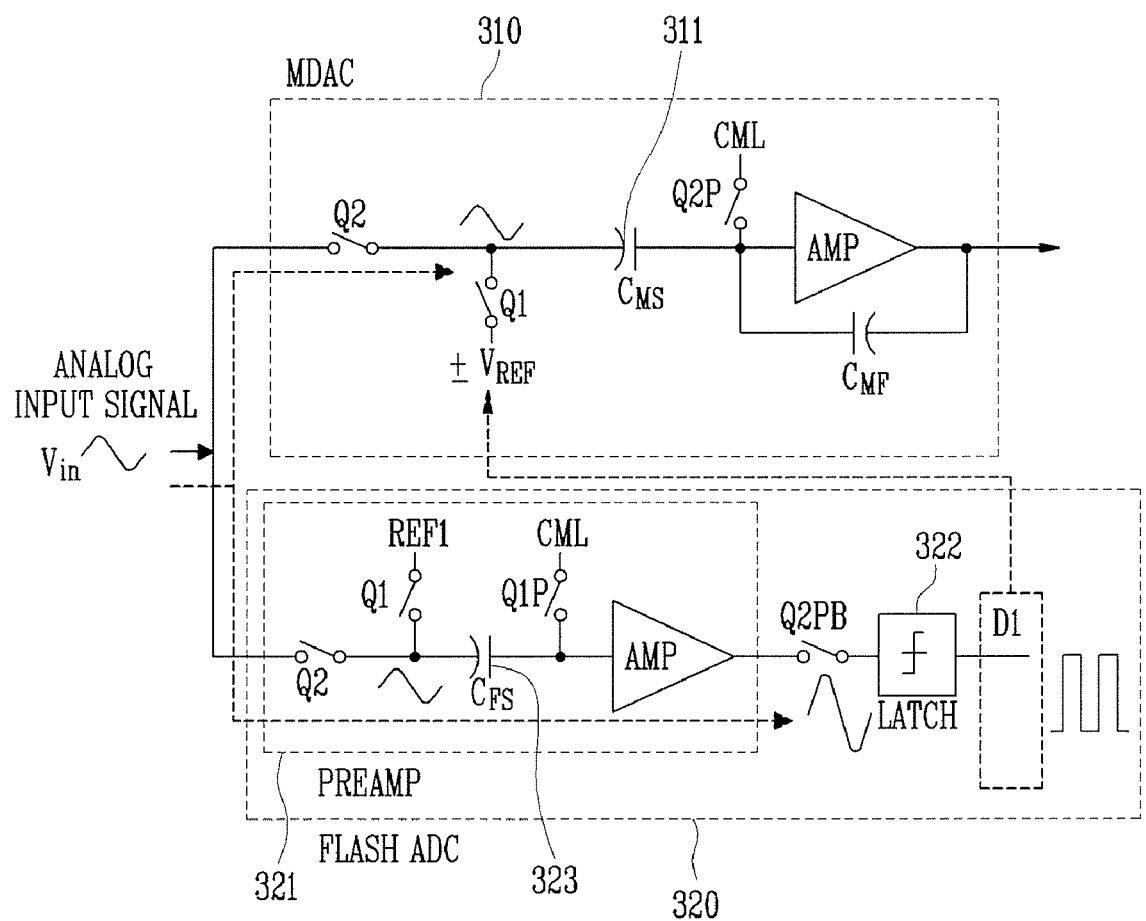
FIG. 3B is a circuit diagram of a stage operating according to a conventional clock.
Figure 4A:
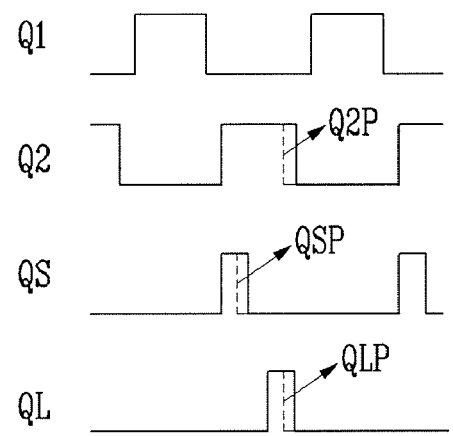
FIG. 4A is a timing diagram showing a stage-operating clock according to a first exemplary embodiment of the present invention.
Figure 4B:
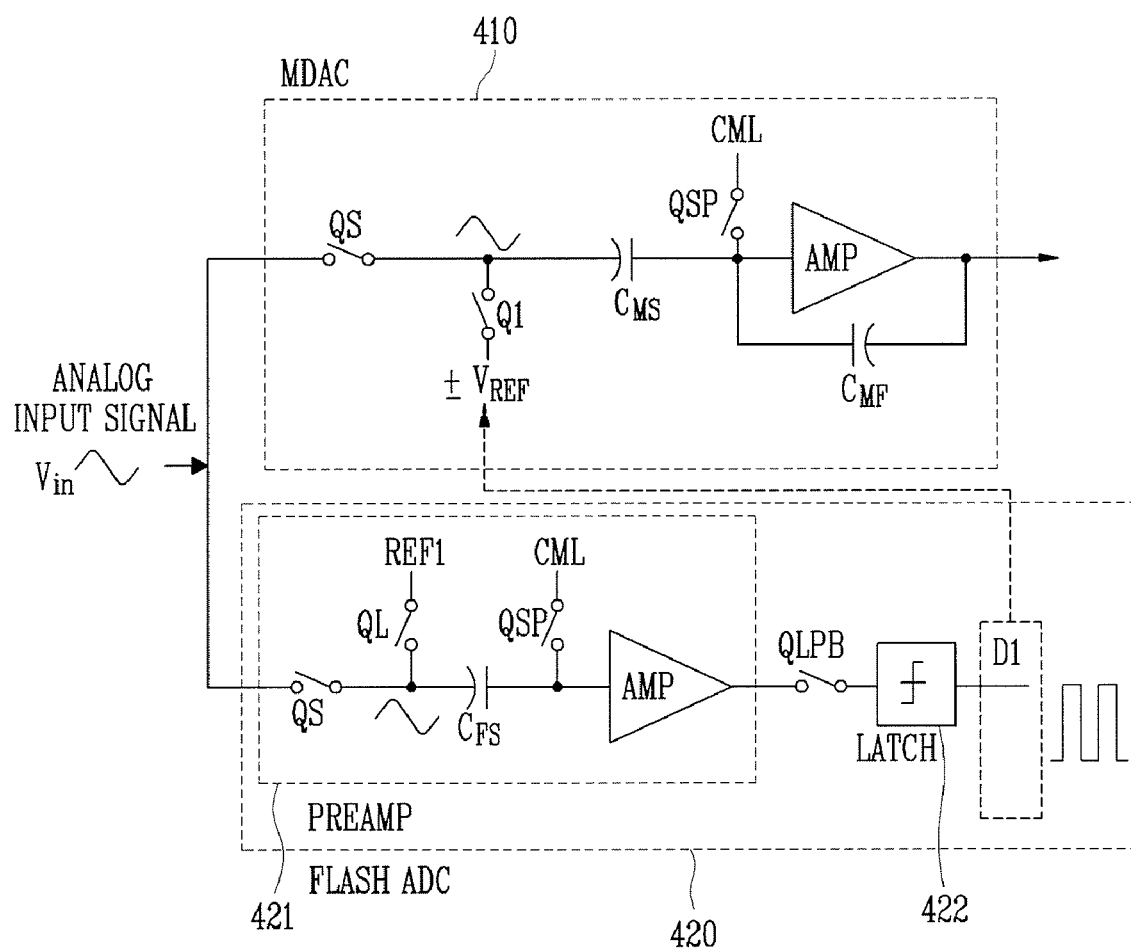
FIG. 4B is a circuit diagram of a stage operating according to an operating clock in accordance with the first exemplary embodiment of the present invention.

FIG. 4A is a timing diagram showing a stage-operating clock according to a first exemplary embodiment of the present invention. FIG. 4B is a circuit diagram of a stage operating according to an operating clock in accordance with the first exemplary embodiment of the present invention.

Referring to FIGS. 4A and 4B, the circuit of a stage according to the first exemplary embodiment of the present invention has the same structure as the circuit of a conventional stage using a Multiplying Digital-to-Analog Converter (MDAC) and a flash Analog-to-Digital Converter (ADC), except that a clock applied to a switch is modified.

In a conventional pipeline ADC with a Sample-and-Hold Amplifier (SHA), the SHA holds an analog input signal while a Q2 clock is high. Therefore, even if the point in time when an MDAC samples an analog input signal in a first stage is different from the point in time when a flash ADC samples the analog input signal, it is possible to ensure that the same values are sampled. However, in a structure without an SHA, it is not possible to ensure that the same values are sampled at the Q2 clock. Thus, the Q2 clock may be divided into a QS clock and a QL clock, an MDAC and a flash ADC may simultaneously sample an analog input signal at the QS clock, and then the preamp of the flash ADC may amplify the analog input signal at the QL clock.

Referring to FIG. 4B, an MDAC 410 and a flash ADC 420 simultaneously sample an analog input signal during the QS phase. In other words, the analog input signal is directly sampled on a capacitor $C_{MS}$ of the MDAC 410 and a capacitor $C_{FS}$ of a preamp of the flash ADC 420 by the same QSP clock. Subsequently, during the QL phase, the flash ADC 420 amplifies the sampled analog input signal and converts it into a digital code corresponding to the sampled analog input signal while the MDAC 410 holds the sampled analog input signal. Subsequently, at a next Q1 clock, the MDAC 410 generates a residual signal using the digital code. In this way, the Q2 clock is divided into 2 parts, and the MDAC 410 and the flash ADC 420 are made to simultaneously sample an analog input signal, thereby minimizing sampling mismatch without an SHA. In addition, amplification duration, i.e., the Q1 clock, for the MDAC 410 to generate the residual signal is the same as that of a conventional pipeline ADC. Thus, neither additional power consumption nor increase in area occurs.

Figure 5:
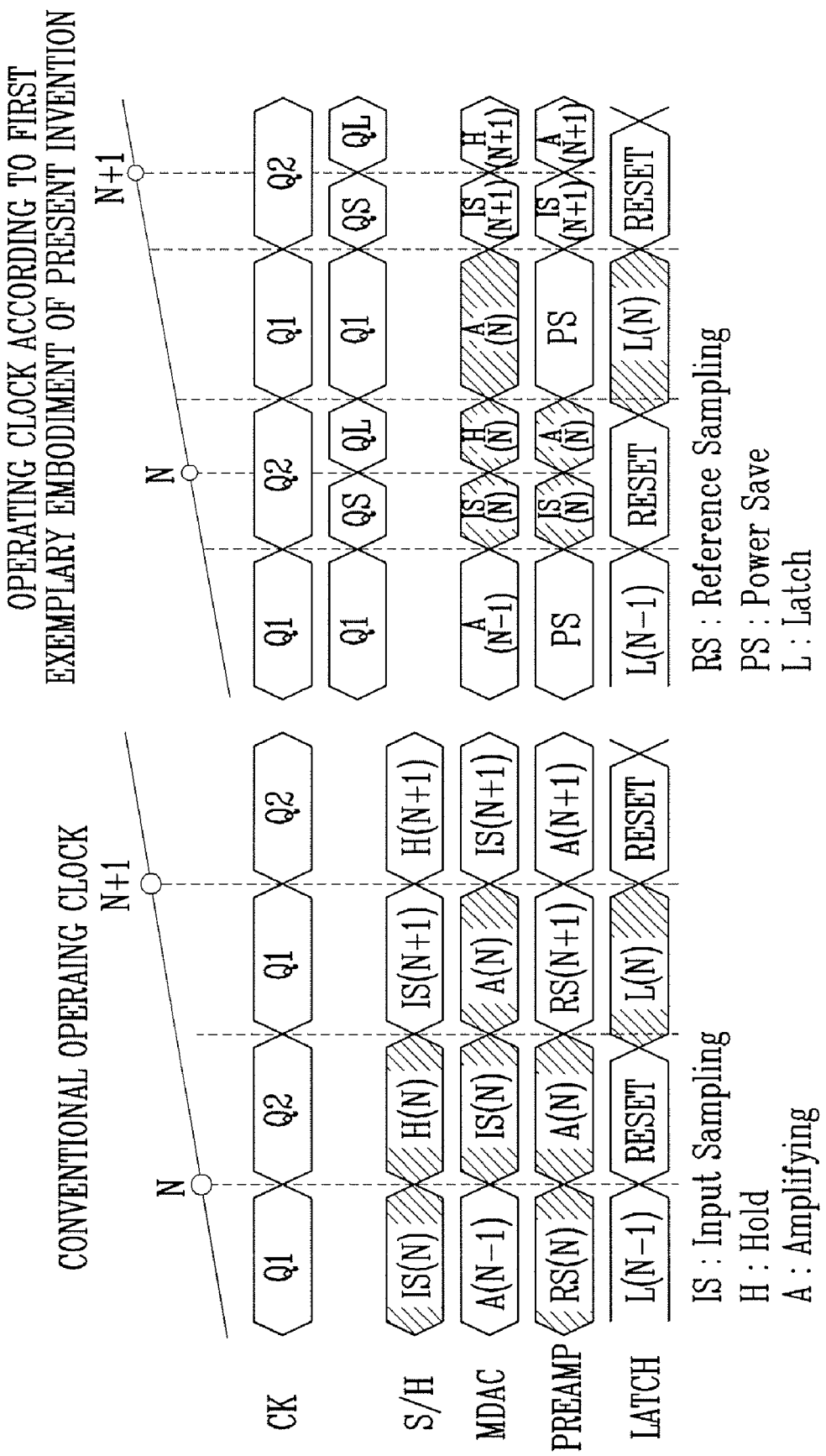
FIG. 5 illustrates timing diagrams comparing a conventional operating clock with an operating clock according to the first exemplary embodiment of the present invention.

FIG. 5 illustrates timing diagrams comparing a conventional operating clock with an operating clock according to the first exemplary embodiment of the present invention.

Referring to FIG. 5, in a conventional pipeline ADC with an SHA, the SHA samples an analog input signal at a Q1 clock and holds the sampled signal during a Q2 clock. Thus, at the Q2 clock, an MDAC samples the held input signal, the preamp of a flash ADC amplifies the held input signal, and the latch of the flash ADC generates and transfers a digital code to the MDAC before a next Q1 clock begins. At the next Q1 clock, the MDAC calculates a residual value using the digital code, and then amplifies the residual value, thereby generating a residual signal.

Meanwhile, in a pipeline ADC without an SHA, an analog signal having a signal value varying according to time is directly applied to an MDAC and a preamp. Thus, sampling mismatch occurs between the MDAC and a flash ADC due to the delay time of the preamp. To solve this problem, the Q2 clock, which is an operating clock according to an exemplary embodiment of the present invention, is divided into a QA clock and a QL clock. During the QS clock, the MDAC and the flash ADC simultaneously sample the analog input signal. Subsequently, during the QL clock, the preamp amplifies an input signal, and a latch converts the amplified signal into a digital code. The succeeding operation is the same as the conventional pipeline ADC.

Figure 6A:
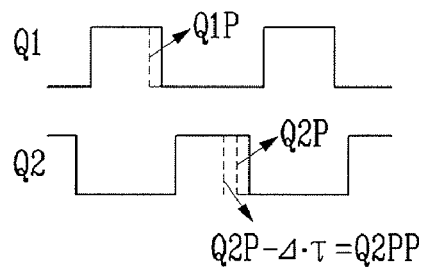
FIG. 6A is a timing diagram showing a stage-operating clock according to a second exemplary embodiment of the present invention.
Figure 6B:
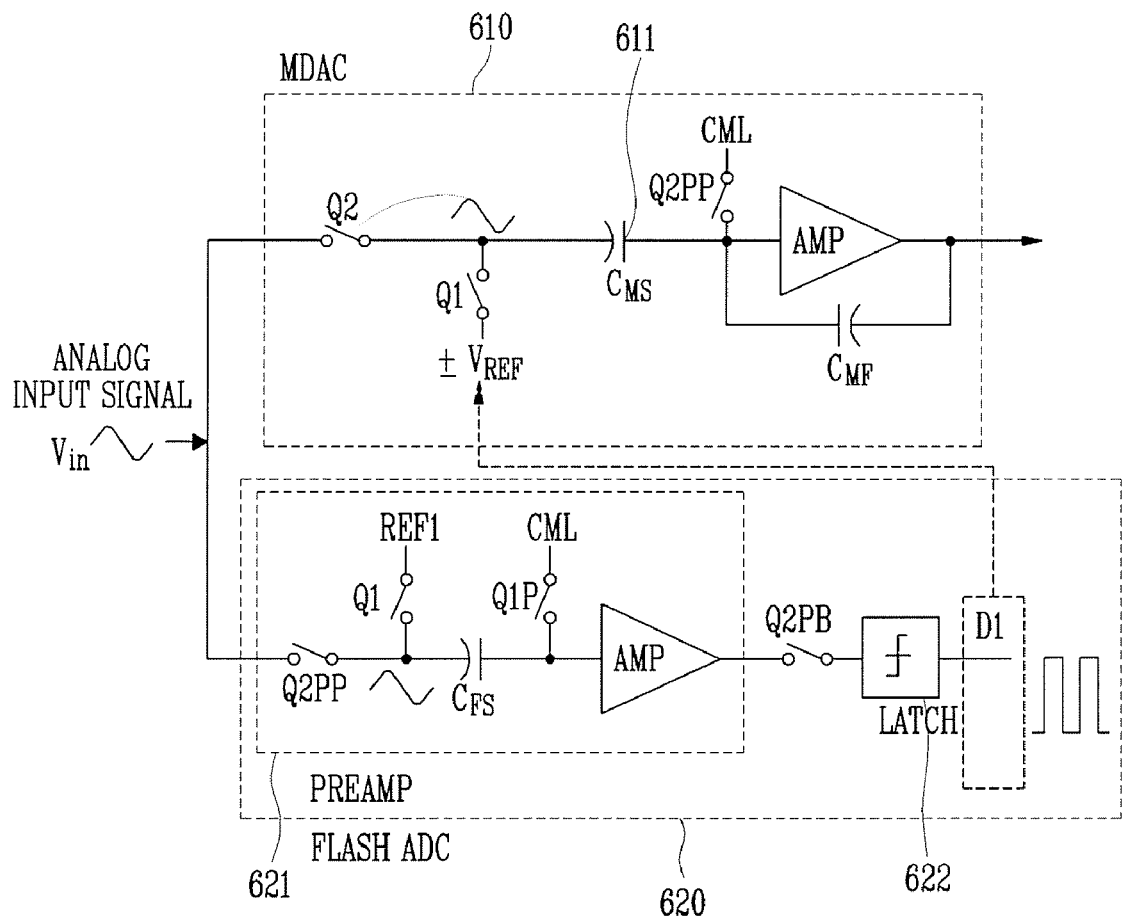
FIG. 6B is a circuit diagram of a stage operating according to an operating clock in accordance with the second exemplary embodiment of the present invention.

FIG. 6A is a timing diagram showing a stage-operating clock according to a second exemplary embodiment of the present invention. FIG. 6B is a circuit diagram of a stage operating according to an operating clock in accordance with the second exemplary embodiment of the present invention.

Referring to FIGS. 6A and 6B, like the first exemplary embodiment of the present invention, a circuit of the stage according to the second exemplary embodiment of the present invention also has the same structure as a circuit of a conventional stage using an MDAC and a flash ADC, except that a clock applied to a switch is modified.

As described above, sampling mismatch is caused by delay time taken by an input signal to pass through a preamp in a flash ADC. Therefore, when the MDAC samples an input analog signal ahead of a conventional sampling time by the preamp delay time, it is possible to reduce a difference between a point in time for the MDAC to sample the signal and a point in time for the flash ADC to sample the signal.

Referring to FIG. 6B, a Q2PP clock preceding a Q2P clock by a preamp delay time $\Delta\tau$ is applied to a switch connected with a top plate of a sampling capacitor $C_{MS}$ 611 in an MDAC 610, so that sampling mismatch can be reduced. In addition, the Q2PP clock rather than a Q2 clock is also applied to the input switch of a flash ADC 620 to match sampling times of the MDAC 610 and the flash ADC 620 with each other, so that sampling mismatch can be further reduced. Such a method makes the circuit have almost the same sampling time and amplification time of an MDAC as a conventional pipeline ADC, and thus the circuit neither consumes additional power nor requires larger area.

The present invention minimizes sampling mismatch caused by removing a front-end SHA from a pipeline ADC, thereby ensuring stable performance without a front-end SHA. Therefore, the present invention can reduce chip area and power consumption without a front-end SHA and can improve the performance of the entire pipeline ADC.

In addition, the present invention provides a method of minimizing sampling mismatch by modifying a clock without changing the circuit structure of a conventional pipeline ADC. Therefore, it is possible to reduce additional effort and cost required for changes in design.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of controlling a pipeline Analog-to-Digital Converter (ADC) without a front-end Sample-and-Hold Amplifier (SHA), the method comprising the steps of:
   (a) simultaneously sampling, at an ADC and a residual signal generator included in a first stage, an analog input signal by being triggered by a QS signal within a first Q2 clock pulse and respectively generating a first sampling value and a second sampling value while still within the first Q2 clock pulse;
   (b) holding, at the residual signal generator, the second sampling value, and simultaneously amplifying and converting, at the ADC, the first sampling value into a corresponding digital code by being triggered by a QL signal within the first Q2 clock pulse; and
   (c) generating, at the residual signal generator, a residual signal using the corresponding first sampling value digital code and using the second sampling value in response to a Q1 clock pulse subsequent to the first Q2 clock pulse.

2. The method of claim 1, after step (c), further comprising the step of:
   transferring, at the residual signal generator, the residual signal to a second stage.

3. The method of claim 1, wherein in step (c), the residual signal generator amplifies a value calculated using the second sampling value and the digital code, and generates the residual signal.

4. A pipeline Analog-to-Digital Converter (ADC) without a front-end Sample-and-Hold Amplifier (SHA) comprising a plurality of stages, wherein a first stage comprises:
   an ADC for sampling an analog input signal by being triggered by a QS signal within a first Q2 clock pulse to generate a first sampling value, and for amplifying the first sampling value to convert the first sampling value into a corresponding digital code by being triggered by a QL signal within the first Q2 clock pulse; and
   a residual signal generator for simultaneously sampling the analog input signal together with the ADC to generate a second sampling value by being triggered by the QS signal within the first Q2 clock pulse, and for holding the second sampling value while the ADC amplifies the first sampling value when triggered by the QL signal within the first Q2 clock pulse.

5. The pipeline ADC of claim 4, wherein the residual signal generator generates a residual signal using the second sampling value and the digital code, and transfers the residual signal to a second stage in response to a Q1 clock pulse subsequent to the first Q2 clock pulse.

6. The pipeline ADC of claim 5, wherein the residual signal generator amplifies a value calculated using the digital code and generates the residual signal.

7. The pipeline ADC of claim 4, wherein the ADC comprises a preamp for sampling the analog input signal, generating the first sampling value, and amplifying and outputting the first sampling value.

8. The pipeline ADC of claim 7, wherein the ADC further comprises a latch for determining the digital code using the output value of the preamp.

9. A method of controlling a pipeline Analog-to-Digital Converter (ADC) without a front-end Sample-and-Hold Amplifier (SHA), the method comprising the steps of:
    (a) applying an analog input signal to a residual signal generator and an ADC included in a first stage by being triggered by a QS signal within a first Q2 clock pulse;
    (b) sampling, at the residual signal generator, the analog input signal by being triggered by the QS signal within the first Q2 clock pulse;
    (c) after a delay time of a preamp, determining, at a latch of the ADC, a digital code corresponding to the analog input signal using an output value of the preamp by being triggered by a QL signal within the first Q2 clock pulse; and
    (d) generating, at the residual signal generator, a residual signal using the digital code in response to a Q1 clock pulse subsequent to the first Q2 clock pulse.

10. The method of claim 9, wherein in step (b), when the residual signal generator samples the analog input signal, the preamp of the ADC receives the analog input signal.

11. The method of claim 9, after step (d), further comprising the step of:
    transferring, at the residual signal generator, the residual signal to a second stage.

12. The method of claim 9, wherein in step (d), the residual signal generator amplifies a value calculated using the digital code and generates the residual signal.

13. A pipeline Analog-to-Digital Converter (ADC) without a front-end Sample-and-Hold Amplifier (SHA) comprising a plurality of stages, wherein a first stage comprises:
    a preamp for receiving an analog input signal by being triggered by a QS signal within a first Q2 clock pulse and amplifying and outputting the analog input signal;
    a latch for receiving the output value of the preamp and determining a digital code corresponding to the analog input signal using the output value of the preamp by being triggered by a QL signal within the first Q2 clock pulse; and
    a residual signal generator for sampling the analog input signal by being triggered by a QS signal within the first Q2 clock pulse ahead of a point in time when the latch receives the output value of the preamp by a preamp delay time, and generating a residual signal using the digital code.

14. The pipeline ADC of claim 13, wherein the preamp receives the analog input signal when the residual signal generator samples the analog input signal.

15. The method of claim 1, wherein the QS signal is before the QL signal.

16. The method of claim 1, wherein the method reduces power consumption without a front-end SHA.

* * * * *